United States Patent
Nakabayashi

(10) Patent No.: US 10,193,033 B2
(45) Date of Patent: Jan. 29, 2019

(54) LIGHT EMITTING DEVICE

(71) Applicant: NICHIA CORPORATION, Anan-shi, Tokushima (JP)

(72) Inventor: Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/383,184

(22) Filed: Dec. 19, 2016

(65) Prior Publication Data

US 2017/0186925 A1    Jun. 29, 2017

(30) Foreign Application Priority Data

Dec. 25, 2015  (JP) .................................. 2015-252881

(51) Int. Cl.
| | |
|---|---|
| *H01L 33/56* | (2010.01) |
| *H01L 33/08* | (2010.01) |
| *H01L 33/46* | (2010.01) |
| *H01L 33/38* | (2010.01) |
| *H01L 33/58* | (2010.01) |
| *H01L 25/075* | (2006.01) |

(52) U.S. Cl.
CPC .......... *H01L 33/56* (2013.01); *H01L 25/0753* (2013.01); *H01L 33/08* (2013.01); *H01L 33/38* (2013.01); *H01L 33/46* (2013.01); *H01L 33/58* (2013.01)

(58) Field of Classification Search
CPC ......... H01L 33/08; H01L 33/38; H01L 33/46; H01L 33/56
See application file for complete search history.

(56) References Cited

U.S. PATENT DOCUMENTS

| | | | | |
|---|---|---|---|---|
| 8,896,199 | B2* | 11/2014 | Ito ......................... | H01L 33/505 313/502 |
| 2009/0194782 | A1 | 8/2009 | Hata et al. | |
| 2011/0284822 | A1* | 11/2011 | Jung ..................... | H01L 33/505 257/13 |
| 2011/0300644 | A1 | 12/2011 | Akimoto et al. | |
| 2012/0063168 | A1* | 3/2012 | Nambu ................ | G02B 6/0031 362/609 |

(Continued)

FOREIGN PATENT DOCUMENTS

| | | |
|---|---|---|
| JP | 2007-266313 A | 10/2007 |
| JP | 2009-188201 A | 8/2009 |

(Continued)

*Primary Examiner* — Christine Enad
(74) *Attorney, Agent, or Firm* — Global IP Counselors, LLP

(57) ABSTRACT

A light emitting device includes a plurality of light emitting elements, a light transmissive member, a first member and a second member. Each of the light emitting elements has a pair of electrodes on a lower surface thereof. The light-transmissive member is disposed on an upper surface of each of the light emitting elements to transmit light from the light emitting elements. The first member is disposed on one or more lateral surfaces of the light-transmissive member and constitutes part of an upper surface of the light emitting device. The second member surrounds an outer periphery of each of the light emitting elements and constitutes part of a lower surface of the light emitting device. Lower surfaces of the electrodes are exposed from the second member.

22 Claims, 6 Drawing Sheets

(56) References Cited

U.S. PATENT DOCUMENTS

| | | | |
|---|---|---|---|
| 2012/0104452 A1* | 5/2012 | Miyoshi | H01L 25/0753 257/99 |
| 2012/0112228 A1* | 5/2012 | Tsuyoshi | H01L 25/0753 257/98 |
| 2015/0188004 A1* | 7/2015 | Ozeki | H01L 33/507 257/98 |
| 2015/0207045 A1* | 7/2015 | Wada | H01L 33/505 257/88 |
| 2015/0270512 A1* | 9/2015 | Yamae | H01L 51/5268 257/40 |
| 2015/0340546 A1* | 11/2015 | Suzuki | H01L 33/0079 438/27 |
| 2015/0340574 A1 | 11/2015 | Tamaki | |
| 2015/0380622 A1 | 12/2015 | Miyoshi et al. | |

FOREIGN PATENT DOCUMENTS

| | | |
|---|---|---|
| JP | 2012-019201 A | 1/2012 |
| JP | 2012-134335 A | 7/2012 |
| JP | 2015-092622 A | 5/2015 |
| JP | 2015-119010 A | 6/2015 |
| JP | 2015-122452 A | 7/2015 |
| JP | 2015-126209 A | 7/2015 |
| JP | 2015-164234 A | 9/2015 |
| JP | 2015-185760 A | 10/2015 |
| JP | 2015-220446 A | 12/2015 |
| JP | 2016-027620 A | 2/2016 |

\* cited by examiner

LIGHT EMITTING DEVICE

CROSS-REFERENCE TO RELATED APPLICATIONS

This application claims priority to Japanese Patent Application No. 2015-252881 filed on Dec. 25, 2015. The entire disclosure of Japanese Patent Application No. 2015-252881 is hereby incorporated herein by reference.

BACKGROUND

The present disclosure relates to a light emitting device.

A semiconductor light emitting device has a red light emitting element, a blue light emitting element, and a green light emitting element mounted in the recess of a package (for example, Japanese Unexamined Patent Publication No. 2009-188201) has been proposed. This allows a single semiconductor light emitting device to emit various colors of light.

SUMMARY

A light emitting device according to one embodiment of the present disclosure includes a plurality of light emitting elements, a light transmissive-member, a first member and a second member. Each of the light emitting elements has a pair of electrodes on a lower surface thereof. The light-transmissive member is disposed on an upper surface of each of the light emitting elements to transmit light from the light emitting elements. The first member is disposed on one or more lateral surfaces of the light-transmissive member and constitutes part of an upper surface of the light emitting device. The second member surrounds an outer periphery of each of the light emitting elements and constitutes part of a lower surface of the light emitting device. Lower surfaces of the electrodes are exposed from the second member.

DETAILED DESCRIPTION

Embodiments of the present invention will now be described through reference to the drawings. In the following description, terms will be used that indicate a particular direction or position, as needed (for instance, terms such as "upper" and "lower," and other terms that include these terms). The use of these terms is intended to facilitate an understanding of the invention through reference to the drawings, and the technological scope of the present invention is not limited to or by the meaning of these terms. Also, portions that are numbered the same in two or more drawings indicate the same portions or members.

With a light emitting device equipped with a plurality of light emitting elements, when one of the light emitting elements is lit independently, the light may be absorbed by the other light emitting elements, which may decrease the light extraction efficiency.

It is an object of the certain embodiments of the present disclosure to provide a light emitting device with a higher light extraction efficiency.

Light Emitting Device According to Embodiment 1

Figure 1:
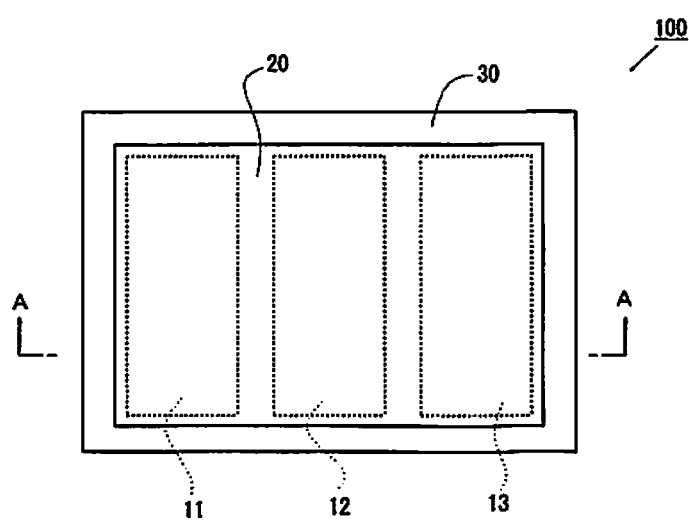
FIG. 1 is a schematic plan view of the light emitting device according to Embodiment 1.
Figure 2:
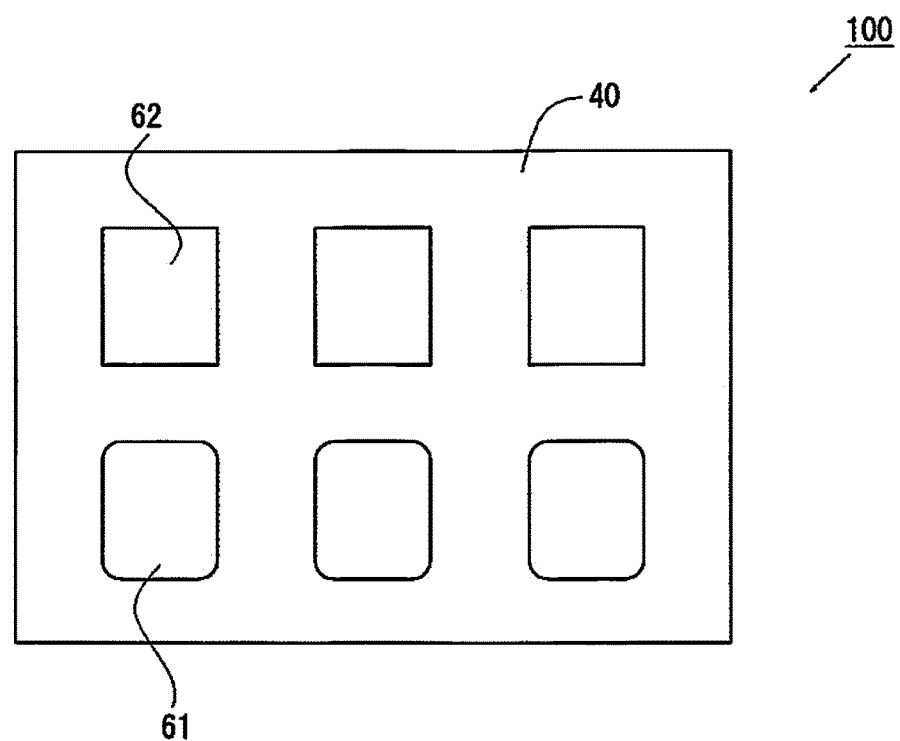
FIG. 2 is a schematic bottom view of the light emitting device according to Embodiment 1.
Figure 3:
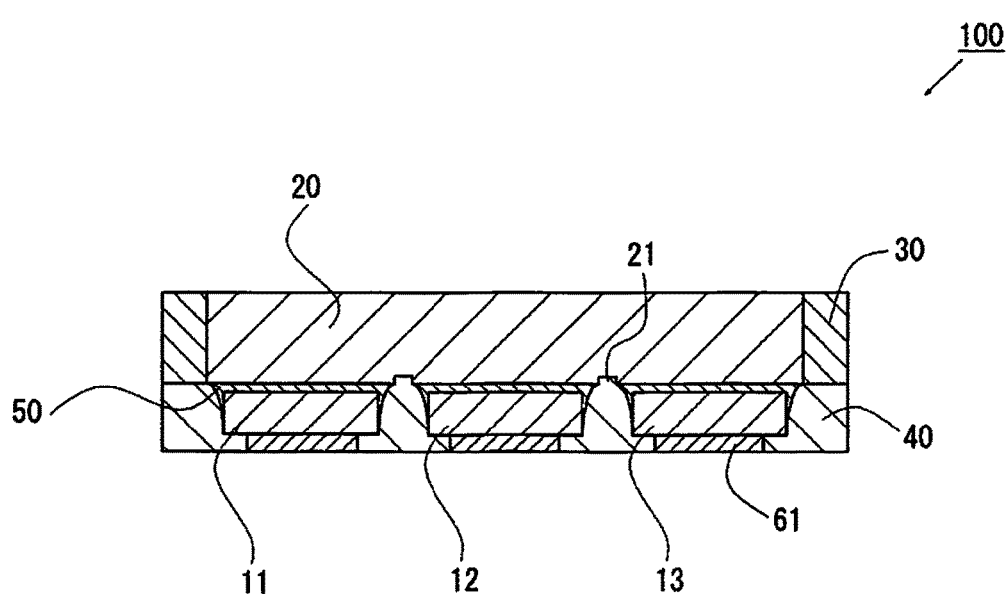
FIG. 3 is a schematic cross sectional view along the A-A line in FIG. 1 of the light emitting device according to Embodiment 1.

The light emitting device 100 according to Embodiment 1 shown in FIGS. 1, 2, and 3 includes a plurality of light emitting elements 11, 12, 13 each having different emission wavelengths, a light-transmissive member 20 disposed on the upper surfaces of these light emitting elements 11, 12, 13, a first member 30 provided on the lateral surfaces of the light-transmissive member 20, and a second member 40 provided so as to surround the outer periphery of the light emitting elements 11, 12, 13. Each of the light emitting elements 11, 12, 13 has a pair of electrodes on its lower surface, and the lower surfaces of these electrodes are exposed from the second member 40 to make an electrical connection with the outside.

With the light emitting device 100 configured in this way, since the second member 40 surrounds the outer periphery of the light emitting elements 11, 12, 13, when the light emitting elements 11, 12, 13 are lit individually, the absorption of light by adjacent light emitting elements can be reduced, so a light emitting device 100 with high light extraction efficiency can be obtained.

Light Emitting Elements

For the light emitting elements, light emitting diodes are preferably used. Two or more of the light emitting elements are included, and the two or more light emitting elements have different emission wavelengths.

The light emitting device 100 according to Embodiment 1 includes a plurality of light emitting elements 11, 12, 13. The light emitting elements 11, 12, 13 are selected so that they each have a different wavelength emission. For example, a combination of three types of light emitting element that emit red, green, and blue light is preferably used for a light emitting device that is used in a full-color display device, as this may afford better color reproduction in the display device.

The light emitting diodes in which a stacked structure having a light emitting layer on the light-transmissive substrate can be used for the light emitting elements. Examples of the semiconductor material include ZnSe, nitride-based semiconductor ($In_X Al_Y Ga_{1-X-Y} N$, $0 \leq X$, $0 \leq Y$, $X+Y \leq 1$), GaP for the light emitting element emitting light of blue (emission wavelength 430 nm to 490 nm) or green (emission wavelength 495 nm to 570 nm), GaAlAs, AlInGaP for the light emitting element emitting light of red (emission wavelength 610 nm to 750 nm). The light-transmissive substrate can employ a light-transmissive insulating material such as sapphire ($Al_2O_3$), and a semiconductor material that can transmit light emitted from the semiconductor stacked body (e.g., a nitride based semiconductor material).

The light emitting elements include, for example, a light-transmissive substrate that is located on the emission surface side, and a semiconductor stacked body that is provided to the surface on the opposite side from the light-transmissive substrate, and a pair of electrodes (an n-side electrode and a p-side electrode) is formed on the surface of the semiconductor stacked body. The semiconductor stacked body includes, for example, an n-type semiconductor layer and a p-type semiconductor layer. One of the pair of electrodes is connected to either the n-type semiconductor layer or the p-type semiconductor layer, and the other electrode is connected to the other of the n-type semiconductor layer and a p-type semiconductor layer.

A good conductor can be used for the pair of electrodes of the light emitting elements. For example, a single-layer film of gold, copper, nickel, or silver or an alloy of these can be used, or a multilayer film of these can be used. Each pair of electrodes is exposed from the second member for electrical connection with the outside. This allows the light emitting elements to be driven individually.

The size and shape of the light emitting elements in plan view are preferably about the same. Also, the light emitting elements are preferably disposed so as to be substantially quadrangular as a whole in plan view. This allows all of the light emitting elements together to be covered by a quadrangular light-transmissive member.

In the case that the light emitting elements have various sizes and shapes in plan view, the light emitting elements disposed on a lower surface of the light-transmissive member can each be positioned in a region which is equally divided into the number of the light emitting elements, thereby improving an uniformity of chromaticity distribution on the light output surface of the light emitting device.

Light-Transmissive Member

With the light emitting device 100 in Embodiment 1, the light-transmissive member 20 is provided so that the lower surface of the light-transmissive member 20 faces the emission surfaces of the light emitting elements, and covers these emission surfaces. With this arrangement, the light emitted by the light emitting elements is transmitted by the light-transmissive member 20 and emitted to the outside. With the light emitting device 100 in Embodiment 1, the light-transmissive member 20 is preferably provided so as to cover the entire emission surfaces of the light emitting elements, and more preferably is provided so as to cover the entire emission surfaces of the light emitting elements and so that the outer peripheral surface of the light-transmissive member 20 is located to the outside of the lateral surfaces of the light emitting elements, as shown in FIGS. 1 and 3. The upper surface of the light-transmissive member 20 constitutes part of the upper surface of the light emitting device 100, as the light output surface of the light emitting device 100.

With the light emitting device in Embodiment 1, the light-transmissive member 20 may have one or more grooves or one or more projections on its lower surface. The grooves or projections are provided at locations between the light emitting elements. In other words, the lower surface of the light-transmissive member 20 is divided up into a plurality of regions by these grooves or projections, and the light emitting elements are disposed in these regions respectively. The outer edges of the regions may be surrounded by the grooves or projections. When the lower surface of the light-transmissive member 20 has these grooves or projections, the wet spreading of the uncured adhesive material used to join the light-transmissive member 20 and the light emitting elements with an adhesive material 50 (discussed below) can be stopped by the grooves or projections. Also, the adhesive material may afford a self-aligning effect that allows the light emitting elements to be disposed precisely at the desired locations.

The cross sectional shape of the grooves or projections may, for example, be rectangular, triangular, semicircular, trapezoidal, or a combination of these shapes.

The light-transmissive member has light-transmissive properties. The term light-transmissive as used in the present specification refers to a material that transmits at least 50% of visible light in a state in which the light-transmissive member is disposed in the light emitting device. More specifically, the light-transmissive member preferably transmits at least 70% of the light from the light emitting elements, and more preferably at least 80%. This allows the light emitted from the light emitting elements to be taken off to the outside more efficiently.

Examples of such a material include a molded article made of a silicone resin, a modified silicone resin, an epoxy resin, a modified epoxy resin, a phenol resin, a polycarbonate resin, an acrylic resin, a trimethylpentene resin, a polynorbornene resin, or a hybrid resin containing one or more of these resins. It is particularly preferable to use a silicone resin with good resistance to weather and heat. A glass silicate, a glass borosilicate, quartz glass, or another such glass material, or sapphire or another such inorganic material can also be used.

As long as it is light-transmissive, the light-transmissive member may contain various kinds of light diffusion materials, light reflecting materials, dyes or pigments as colorants, and other additives, either in its interior or on its surface. Examples of the light-reflecting material include titanium oxide, silicon oxide, zirconium oxide, potassium titanate, alumina, aluminum nitride, magnesium oxide, boron nitride, mullite, niobium oxide and various rare earth oxides (e.g., yttrium oxide, gadolinium oxide). Examples of the light diffusion material includes calcium carbonate, aluminum oxide, barium sulfate, titanium oxide, aluminum oxide and silicon oxide. Examples of the colorant include carbon black, chromium oxide, manganese dioxide and iron oxide. Examples of the additive include glass fibers, fibrous fillers such as wollastonite, carbon, and inorganic fillers such as silicon oxide. These materials can be contained in an amount of about 5 to about 50 wt % with respect to the total weight of the molded resin.

Any shape of the light transmissive member can be used. In order to extract the light emitted from the light emitting elements, the lower surface of the light transmissive member preferably has a larger surface area than the upper surfaces of the light emitting elements, so that the light emitting element upper surfaces can be entirely covered by the light-transmissive member. The thickness of the light-transmissive member can be, for example, about 20 µm to about 500 µm, however, it can be appropriately altered.

First Member

The first member is used to hold the light-transmissive member and to reduce the leakage of light from the lateral surfaces of the light-transmissive member.

The first member constitutes the surface of the light emitting device 100, and as such may be exposed to the external environment, so it is preferable to use a molded resin with high strength and good weather resistance, or high gas barrier properties. Also, to improve the contrast of the light emitting device, it is preferable to use a material with low reflectivity with respect to sunlight and other external light, and one that is black or a color similar to black is preferable.

With the light emitting device in Embodiment 1, the first member 30 is provided around the light-transmissive member 20, and preferably contacting with the light-transmissive member 20, it may reduce the leakage of light from the lateral surfaces of the light-transmissive member 20, and can hold the light-transmissive member 20. The first member 30 is preferably disposed contacting with the entire lateral surfaces of the light-transmissive member 20. Also, the lower surface of the first member 30 is preferably disposed lower than the lower surface of the light-transmissive member 20, or substantially flush with the lower surface of the light-transmissive member 20. This allows the leakage of light from the lateral surfaces of the light-transmissive member 20 to be effectively reduced, and the light-transmissive member 20 to be held securely.

With the light emitting device in Embodiment 1, the surface of the first member 30 constitutes part of the upper surface of the light emitting device 100, and surrounds the light output surface of the light emitting device 100 (the upper surface of the light-transmissive member 20). The upper surface of the first member 30 is preferably substantially flush with the upper surface of the light-transmissive member 20. This can clearly define a boundary between the light output surface configured with the upper surface of the light-transmissive member 20, and the non-emission surface configured with the upper surface of the first member 30 at the upper surface of the light emitting device.

The first member 30 can be made from a resin containing a light absorbing substance. Examples of the resin material include silicone resin, epoxy resin, silicone-modified resins, epoxy-modified resin, polyimide resin, modified polyimide resin, polyphthalamide (PPA), polycarbonate, polyphenylene sulfide (PPS), unsaturated polyester, liquid crystal polymer (LCP), ABS resins, phenol resins, acrylic resins and PBT resins.

Examples of light absorbing substances include black pigments and carbon black. A light reflecting substance may also be used in addition to the light absorbing substance. Examples of the light reflecting substance include titanium oxide, silicon oxide, zirconium oxide, potassium titanate, alumina, aluminum nitride, boron nitride and mullite. The type and amount of the light absorbing substance, light reflecting substance can be adjusted as needed, as dictated by the type of light absorbing substance and light reflecting substance being used.

The thickness of the first member (that is, the height from the upper surface to the lower surface of the first member) is preferably equal to or greater than the thickness of the light-transmissive member 20. Also, the thickness of the first member at the lateral surfaces of the light emitting device 100 is preferably greater than the thickness of the second member. In other words, at least half of the height of the lateral surfaces of the light emitting device 100 is preferably constituted by the first member. Further, the first member preferably constitutes part of a lateral surface of the light emitting device. With this arrangement, in the case that the light emitting device 100 is used for the pixels of an outdoor image display device, for example, the lateral surfaces of the light emitting device 100 may be covered by a waterproof resin, but the greater the proportion of the lateral surfaces of the light emitting device accounted for by the first member is, the greater the distance between the waterproof resin surface and the boundary between the first member and second member is. This can make it less likely that moisture will come in through the boundary between the first member and second member. The phrase "the lateral surfaces of the light emitting device 100" here refers to the lateral surfaces located between the upper surface and lower surface of the light emitting device 100.

With the light emitting device according to Embodiment 1, an epoxy resin that has been colored black is used as the first member. Epoxy resins have good resistance to water and heat, and have good electrical insulation properties, so they are suitable as the material that makes up the surface of the light emitting device 100.

Second Member

The second member 40 is used to hold the light emitting elements and to reduce the absorption of the light emitted from the light emitting elements by adjacent one or more light emitting elements.

With the light emitting device in Embodiment 1, the second member 40 is disposed so as to cover the light emitting elements. The second member 40 is preferably contacting with the lateral surfaces of each of the light emitting elements in between adjacent elements. This may reduce the absorption of light by adjacent light emitting elements when the light emitting elements are lit individually, which may give the light emitting device 100 high light extraction efficiency.

The second member 40 is provided to the lower surfaces of the light emitting elements, and constitutes the lower surface of the light emitting device 100. Therefore, it is preferable for a member with low transmission of the light from the light emitting elements to be used as the second member 40. Also, since the second member 40 covers the lateral surfaces of the light emitting elements, when the light utilization efficiency of the elements is taken into account, it is preferable to use a member with high reflectivity. More specifically, the second member 40 is preferably white or a color similar to white, and more preferably has an optical transmissivity of at least 80%.

The pairs of electrodes of the light emitting elements 11, 12, 13 are exposed at their surface from the second member 40 for the purpose of connection with the outside. That is, the second member 40 may have a thickness equal to the height of the pair of electrodes on each of the light emitting elements 11, 12, 13. In the case that the second member 40 is too thin, light may leak out from the lower surface of the light emitting device 100. Therefore, light leakage from the lower surface of the light emitting device 100 can be reduced by setting the height of the electrodes of the light emitting elements to at least 20 μm.

A member that is softer than the first member is preferably used for the second member. Since the first member makes up part of the upper surface of the light emitting device, it is preferably high in strength, but since the second member is preferably disposed near the light emitting elements, it is preferable to use a material that is flexible with respect to heat and is resistant to thermal expansion, so that the light emitting elements may not be subjected to excessive stress due to thermal expansion. More specifically, when a resin material is used for the second member, for example, it preferably has a Young's modulus of about 10 MPa to 10 GPa.

The second member 40 is provided on the lower surface side of the first member 30. The second member 40 may have another member interposed between itself and the first member 30, but preferably at least the first member and the second member are in contact at the lateral surfaces of the light emitting device 100. That is, the second member preferably constitutes part of a lateral surface of the light emitting device. This allows a path by which light leakage or intrusion of moisture and so forth between the various members at the lateral surfaces of the light emitting device 100 to be small.

The second member 40 can be made from a resin containing a light reflecting substance. Examples of the resin material include silicone resin, modified silicone resin, epoxy resin, modified epoxy resin, it is possible to use a resin such as acrylic resin, also hybrid resin containing these resins one or more, and particularly the silicone resin good in weather resistance and heat resistance can be preferably used.

Examples of the light reflecting substance include titanium oxide, silicon oxide, zirconium oxide, potassium titanate, alumina, aluminum nitride, boron nitride and mullite. This light reflecting substance can be in the form of particles, fibers, flakes, or the like.

The second member may contain a light absorbing substance in order to improve the contrast of the light emitting device. Examples of light absorbing substances include black pigments and carbon black.

With the light emitting device 100 according to Embodiment 1, a phenylsilicone resin that has been colored white is used as the second member. Phenylsilicone resins have high strength and good weather resistance.

Adhesive Material

The upper surfaces of the light emitting element and the lower surface of the light-transmissive member can be joined with a light-transmissive adhesive material 50. The adhesive material 50 may cover the upper surfaces of the light emitting elements and the lower surface of the light-transmissive member. The adhesive material 50 may also cover part of or all of the lateral surfaces of the light emitting elements. The outer surface of the adhesive material in this case preferably covers the lateral surfaces of the light emitting elements so as to be inclined outward from the lower surface side toward the upper surface side of the light emitting elements. When the lateral surfaces of the light emitting elements are covered with the light-transmissive adhesive material 50, the outer surface of the adhesive material may have a inclined surface that is inclined outward from the lower surface side of the light emitting elements toward the upper surface side, and the second member 40 may cover this inclined surface and the part of the lateral surfaces of the light emitting elements exposed from the adhesive material. With this arrangement, light from the light emitting element lateral surfaces may be reflected at the interface between the second member 40 and the adhesive material 50 and may be guided toward the light-transmissive member.

A light-transmissive resin can be used for the adhesive material 50. In particular, the light-transmissive resin can be a silicone resin, a silicone-modified resin, an epoxy resin, a phenol resin, or another such thermosetting resin. Also, the light-transmissive resin may be susceptible to the effect of heat generated when the light emitting elements are lit when the light-transmissive resin comes into contact with the lateral surfaces of the light emitting elements. In this respect, a thermosetting resin is preferable to be used as the light-transmissive resin because of its good heat resistance.

Light Emitting Device According to Embodiment 2

Figure 4:
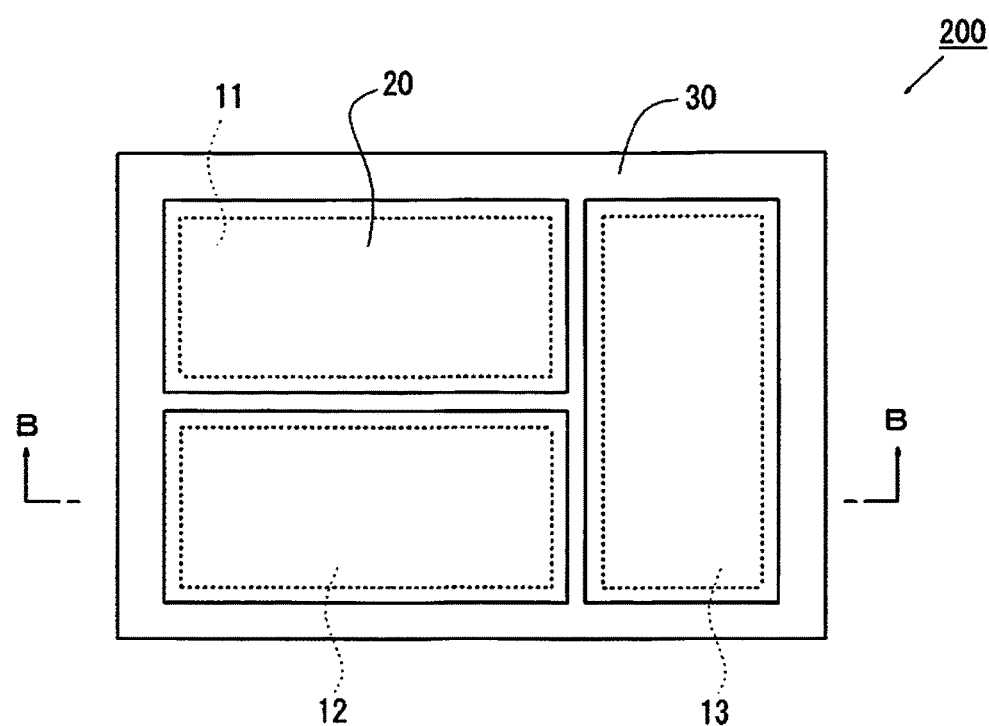
FIG. 4 is a schematic plan view of the light emitting device according to Embodiment 2.
Figure 5:
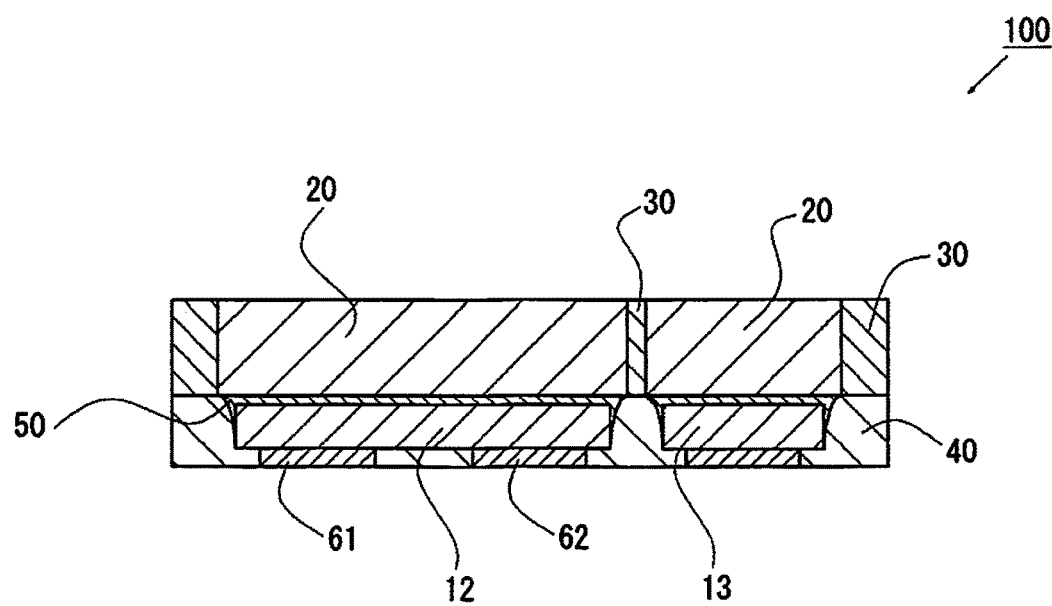
FIG. 5 is a schematic cross sectional view of the light emitting device according to Embodiment 2.

The light emitting device 200 according to Embodiment 2 shown in FIGS. 4 and 5 includes a plurality of light emitting elements 11, 12, 13 with different emission wavelengths, a plurality of light-transmissive members 20 disposed on the upper surfaces of these light emitting elements 11, 12, 13, respectively, a first member 30 disposed on the lateral surfaces of the light-transmissive members 20, and a second member 40 disposed so as to surround the outer periphery of the light emitting elements 11, 12, 13. In other words, the light-transmissive member according to Embodiment 2 includes a plurality of sections (i.e., a plurality of light-transmissive members 20 in FIGS. 4 and 5) corresponding to the light emitting elements 11, 12, 13 so that each of the sections of the light-transmissive member is respectively provided on the upper surface of a corresponding one of the light emitting elements 11, 12, 13. Each of the light emitting elements 11, 12, 13 has a pair of electrodes on its lower surface, and the lower surfaces of these electrodes are exposed from the second member 40 to make an electrical connection with the outside of the light emitting device. The light emitting device 200 according to Embodiment 2 differs from the light emitting device 100 in Embodiment 1 in that it includes a plurality of light-transmissive members 20, and the first member 30 is provided so as to surround the outer periphery of the light-transmissive members 20.

With the light emitting device according to Embodiment 2, as with the light emitting device according to Embodiment 1, light absorption between adjacent light emitting elements can be reduced, so the light emitting device can have high light extraction efficiency. Furthermore, with the light emitting device 200 according to Embodiment 2, since the first member 30 is disposed between a plurality of light-transmissive members, when the light emitting elements are lit individually, the leakage of light between adjacent light-transmissive members can be reduced at the light output surface of the light emitting device 200. With this arrangement, when the light emitting device 200 is used for the pixels of an image display device, for example, an image display device can be obtained in which there is a clear and precise step between the emitting and non-emitting regions. Also, with the light emitting device 200 according to Embodiment 2, the light emitting elements are disposed so that each is adjacent to two other light emitting elements. This is preferable because it affords better color mixing when a plurality of light emitting elements is lit at the same time, for example.

Light Emitting Device According to Embodiment 3

Figure 6:
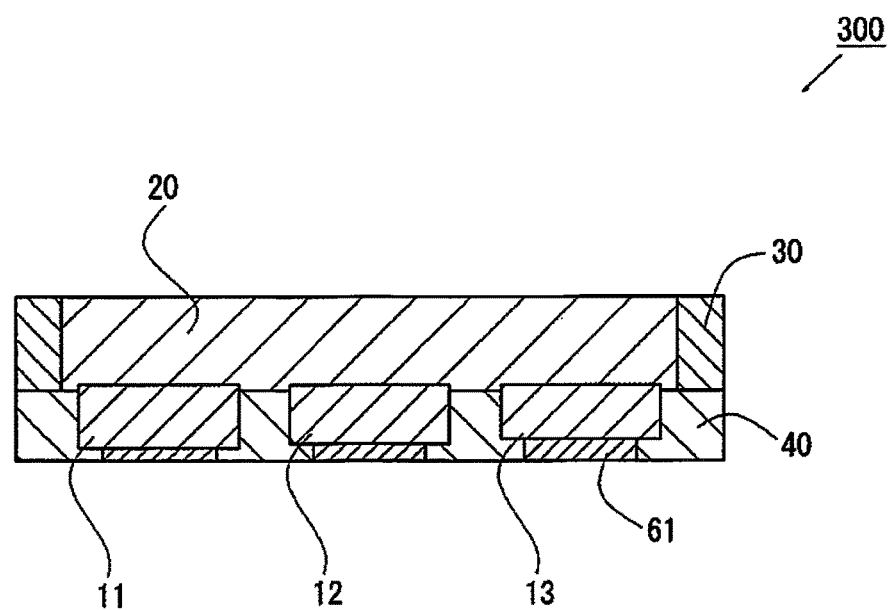
FIG. 6 is a schematic cross sectional view of the light emitting device according to Embodiment 3.

The light emitting device 300 according to Embodiment 3 shown in FIG. 6 includes a plurality of light emitting elements 11, 12, 13 with different emission wavelengths respectively, a light-transmissive member 20 that is disposed on the upper surfaces of these light emitting elements 11, 12, 13, a first member 30 disposed on the lateral surfaces of the light-transmissive member 20, and a second member 40 disposed so as to surround the outer periphery of the light emitting elements 11, 12, 13. Each of the light emitting elements 11, 12, 13 has a pair of electrodes on its lower surface, and the lower surfaces of these electrodes are exposed from the second member 40 to make an electrical connection with the outside of the light emitting device. In the light emitting device 300 according to Embodiment 3, the light-transmissive member and the light emitting elements are fixed without the use of an adhesive material. Also, parts of the light emitting elements are embedded in the light-transmissive member. In other words, the light-transmissive member comprises a plurality of recesses on its lower surface, and the light emitting elements are accommodated in these recesses.

With the light emitting device according to Embodiment 3, as with the light emitting device according to Embodiment 1, light absorption may be reduced between adjacent light emitting elements, so the light emitting device can have high light extraction efficiency. Furthermore, since part of the lateral surfaces of the light emitting element is embedded in the light-transmissive member 20 with the light emitting device according to Embodiment 3, light emits from the lateral surfaces of the light emitting elements can be guided directly to the light-transmissive member 20, which is preferable.

Manufacturing Method of Light Emitting Device According to Embodiments

An embodiment of a manufacturing method of the light emitting device according to the certain embodiments will be described.

(1) Preparation of First Member and Disposition of Light-Transmissive Member

A first member having through-holes is disposed on a support member composed of a heat-resistant sheet. The through-holes pass through a first surface of the first member and a second surface that is on the rear side of the first surface. Just one through-hole may be formed in the first member, or two or more may be formed. The size and shape of the inner surface of the through-hole in plan view may be substantially the same as the external size and shape of the light-transmissive member in the light emitting device 100.

The through-hole may be formed by any method. Examples include irradiation or scribing with laser light, punching, etching, and blasting. Also, a first member having a through-hole may be formed by injection molding, transfer molding, or compression molding using a molding die. Using a molding die can reduce variance in the shape of the first member having the through-holes.

Next, a light-transmissive resin is disposed inside the through-hole. A light-transmissive resin, for example, can be used as the material of the light-transmissive member. In disposing the light-transmissive resin, any method may be used, example of which include printing and potting. The light-transmissive resin may contain a light diffusing material or another such filler.

(2) Fixing of Light Emitting Elements

The light-transmissive member and the upper surfaces of the light emitting elements are bonded preferably by bonding method. The adhesive material is preferably provided not only to the upper surfaces of the light emitting elements, but also to the lateral surfaces of the light emitting elements to increase the bonding strength between the light emitting elements and the light-transmissive member.

In the case that the light-transmissive member itself has adhesive properties, such as when the light-transmissive member contains a resin material and the resin material is in a semi-cured state, etc., the light emitting elements and the light-transmissive member can be fixed without the use of an adhesive material. In this case, part of the lateral surfaces of the light emitting elements may be embedded in the light-transmissive member during fixing. This is preferable because it may improve the bonding strength between the light emitting elements and the light-transmissive member.

In the case that the light emitting elements with different emission wavelengths have different height from others, the depth at which the elements are embedded in the light-transmissive member can be varied so that the height from the upper surface of the light-transmissive member to the lower surfaces of the light emitting elements (that is, the surfaces on which the electrodes are formed) may substantially the same for all the light emitting elements.

(3) Disposition of Second Member

The second member is disposed so as to surround the outer periphery of the light emitting elements. The second member covers all of the lateral surfaces of the plurality of light emitting elements. When an adhesive material is used to bond the light emitting elements and the light-transmissive member, the second member covers the adhesive material disposed on the lateral surfaces of the light emitting elements. Furthermore, a portion of the lower surfaces of the light emitting elements, where the pair of electrodes does not cover, is also covered by the second member. The thickness of the second member here may be adjusted so that part of the lateral surfaces of the electrodes is exposed from the second member. When the upper surface of the first member is used as a reference, the height to the surface of the second member on the opposite side from the surface that faces the first member may be set to be less than or equal to the height of the exposed surfaces of the electrodes.

Also, the pair of the electrodes may be exposed from the second member by forming the second member which has a thickness sufficient to completely embed the pair of electrodes and removing the part of the second member to expose the electrodes. The second member may be removed by any method that is known in this field. Examples of removing process include etching, cutting, grinding, polishing, and blasting. Removing the second member by etching, cutting, grinding, polishing, blasting, or the like is preferable because it leaves the surface of the second member smooth, and this surface will be the lower surface of the light emitting device.

(4) Separating into Individual Light Emitting Devices

A cut is made between adjacent light-transmissive members to separate the first member, the second member, and the support member and obtain individual units. The support members are removed from these units to obtain individual light emitting devices. During cutting, it is preferable not to cut the support members all the way through. This allows the support members to be removed all at once. Alternatively, the support member may be removed prior to cutting.

The embodiments according to the present invention have been specifically explained based on the embodiments above, but the spirit of the present invention should be broadly interpreted based on the scope of claims without limitation to those described above.

What is claimed is:

1. A light emitting device comprising:
a plurality of light emitting elements each having a pair of electrodes on a lower surface thereof;
a light-transmissive member disposed on an upper surface of each of the light emitting elements to transmit light from the light emitting elements;
a first member disposed on one or more lateral surfaces of the light-transmissive member, and constituting part of an upper surface of the light emitting device with an upper surface of the light-transmissive member being exposed from the first member; and
a second member surrounding an outer periphery of each of the light emitting elements, and constituting part of a bottom-most surface of the light emitting device,
wherein lower surfaces of the electrodes are exposed from the second member to constitute part of the bottom-most surface of the light emitting device,
the first member and the second member respectively constitute parts of an outermost lateral surface of the light emitting device, and
the second member is in contact with a part of each of the light emitting elements.

2. The light emitting device according to claim 1, wherein the light-transmissive member includes a plurality of sections corresponding to the light emitting elements so that each of the sections of the light-transmissive member is respectively provided on the upper surface of a corresponding one of the light emitting elements.

3. The light emitting device according to claim 2, wherein the plurality of sections of the light-transmissive member are spaced apart from each other with the first member being disposed between adjacent ones of the plurality of sections.

4. The light emitting device according to claim 1, wherein the second member is softer than the first member.

5. The light emitting device according to claim 1, wherein the second member has a reflectivity higher than that of the first member.

6. The light emitting device according to claim 1, wherein the upper surface of each of the light emitting elements and a lower surface of the light-transmissive member are joined with an adhesive material.

7. The light emitting device according to claim 6, wherein the adhesive material covers part of lateral surfaces of the light emitting elements.

8. The light emitting device according to claim 7, wherein the second member covers outer surfaces of the adhesive material and part of the lateral surfaces of the light emitting elements that is exposed from the adhesive material.

9. The light emitting device according to claim 6, wherein the adhesive material joining one of the light emitting elements and the light-transmissive member is spaced apart from the adhesive material joining an adjacent one of the light emitting elements and the light-transmissive member.

10. The light emitting device according to claim 7, wherein an outer surface of the adhesive material is inclined outwardly from a lower surface side toward an upper surface side of each of the light emitting elements.

11. The light emitting device according to claim 1, wherein the light-transmissive member includes a lower surface on which one or more grooves are formed between the light emitting elements.

12. The light emitting device according to claim 1, wherein the light emitting elements include a first light emitting element that emits red light, a second light emitting element that emits green light, and a third light emitting element that emits blue light.

13. The light emitting device according to claim 1, wherein the first member is made of a resin containing a light absorbing substance.

14. The light emitting device according to claim 1, wherein the second member is made of a resin containing a light reflecting substance.

15. The light emitting device according to claim 1, wherein the first member is made of an epoxy resin.

16. The light emitting device according to claim 1, wherein the second member is made of a silicone resin.

17. The light emitting device according to claim 1, wherein the first member and the second member are in contact at lateral surfaces of the light emitting device.

18. The light emitting device according to claim 1, wherein a height of at least one of the electrodes of the light emitting elements is at least 20 μm.

19. The light emitting device according to claim 1, wherein the color of the first member is black.

20. The light emitting device according to claim 19, wherein the color of the second member is white.

21. The light emitting device according to claim 1, wherein the color of the second member is white.

22. The light emitting device according to claim 1, wherein a thickness of the first member is greater than a thickness of the second member at the outermost lateral surface of the light emitting device.

* * * * *